(12) United States Patent
Li et al.

(10) Patent No.: US 8,289,832 B2
(45) Date of Patent: Oct. 16, 2012

(54) INPUT SIGNAL PROCESSING SYSTEM

(75) Inventors: Shengyuan Li, Irving, TX (US);
Indumini W. Ranmuthu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 541 days.

(21) Appl. No.: 12/606,280

(22) Filed: Oct. 27, 2009

(65) Prior Publication Data
US 2010/0315915 A1 Dec. 16, 2010

Related U.S. Application Data

(60) Provisional application No. 61/186,190, filed on Jun. 11, 2009, provisional application No. 61/186,226, filed on Jun. 11, 2009.

(51) Int. Cl.
*G11B 7/00* (2006.01)
*G11B 7/12* (2012.01)
(52) U.S. Cl. ................................... 369/116; 369/47.5
(58) Field of Classification Search .................. None
See application file for complete search history.

(56) References Cited

U.S. PATENT DOCUMENTS

| | | | |
|---|---|---|---|
| 4,837,787 A * | 6/1989 | Takesue et al. | 372/29.02 |
| 5,097,473 A * | 3/1992 | Taguchi | 372/29.011 |
| 5,175,722 A * | 12/1992 | Minami et al. | 369/116 |
| 6,728,183 B1 * | 4/2004 | Takeuchi et al. | 369/53.27 |
| 8,009,546 B2 * | 8/2011 | Li et al. | 369/116 |
| 2005/0013228 A1 * | 1/2005 | Miyamoto et al. | 369/59.11 |
| 2005/0238072 A1 * | 10/2005 | Uesaka | 372/38.02 |

* cited by examiner

*Primary Examiner* — Christopher R Lamb
(74) *Attorney, Agent, or Firm* — Lawrence J. Bassuk; W. James Brady; Frederick J. Telecky, Jr.

(57) ABSTRACT

An input signal processing system is described. It comprises a first transconductance device having a first input, second input, and an output, wherein the first input is coupled to receive the input signal; a first resistor coupled to a first input of the first transconductance device, wherein the first resistor converts the input current signal to an input voltage signal; a first voltage-current converter coupled to the output, the second input, the resistor, and a low voltage supply, wherein the first voltage-current converter is operative for converting the input voltage signal to a input current signal; and a low pass filter having an input coupled to the voltage converter for filtering noise from the input current signal.

20 Claims, 6 Drawing Sheets

INPUT SIGNAL PROCESSING SYSTEM

CROSS REFERENCE TO RELATED APPLICATIONS

The present application claims priority to jointly owned U.S. Provisional Application corresponding to application No. 61/186,190 entitled, "Laser Diode Driver Current Input Signal Processing System." This provisional application was filed on Jun. 11, 2009. The present application also claims priority to jointly owned U.S. Provisional Application corresponding to application No. 61/186,226 entitled, "Over Current Protection Device." This provisional application was filed on Jun. 11, 2009.

DESCRIPTION OF RELATED ART

With the evolution of electronic devices, there is a continual demand for enhanced speed, capacity and efficiency in various areas including electronic data storage. Motivators for this evolution may be the increasing interest in video (e.g., movies, family videos), audio (e.g., songs, books), and images (e.g., pictures). Optical disk drives have emerged as one viable solution for supplying removable high capacity storage. When these cloves include light sources, signals sent to these sources should be properly processed to reduce potential damage and maintain appropriate light emission.

BRIEF DESCRIPTION OF THE DRAWINGS

The input signal processing system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

While the input signal processing system is susceptible to various modifications and alternative forms, specific embodiments have been shown by way of example in the drawings and subsequently are described in detail. It should be understood, however, that the description herein of specific embodiments is not intended to limit the input signal processing system to the particular forms disclosed. In contrast, the intention is to cover all modifications, equivalents, and alternatives falling within the spirit and scope of the input signal processing system as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Figure 1A:
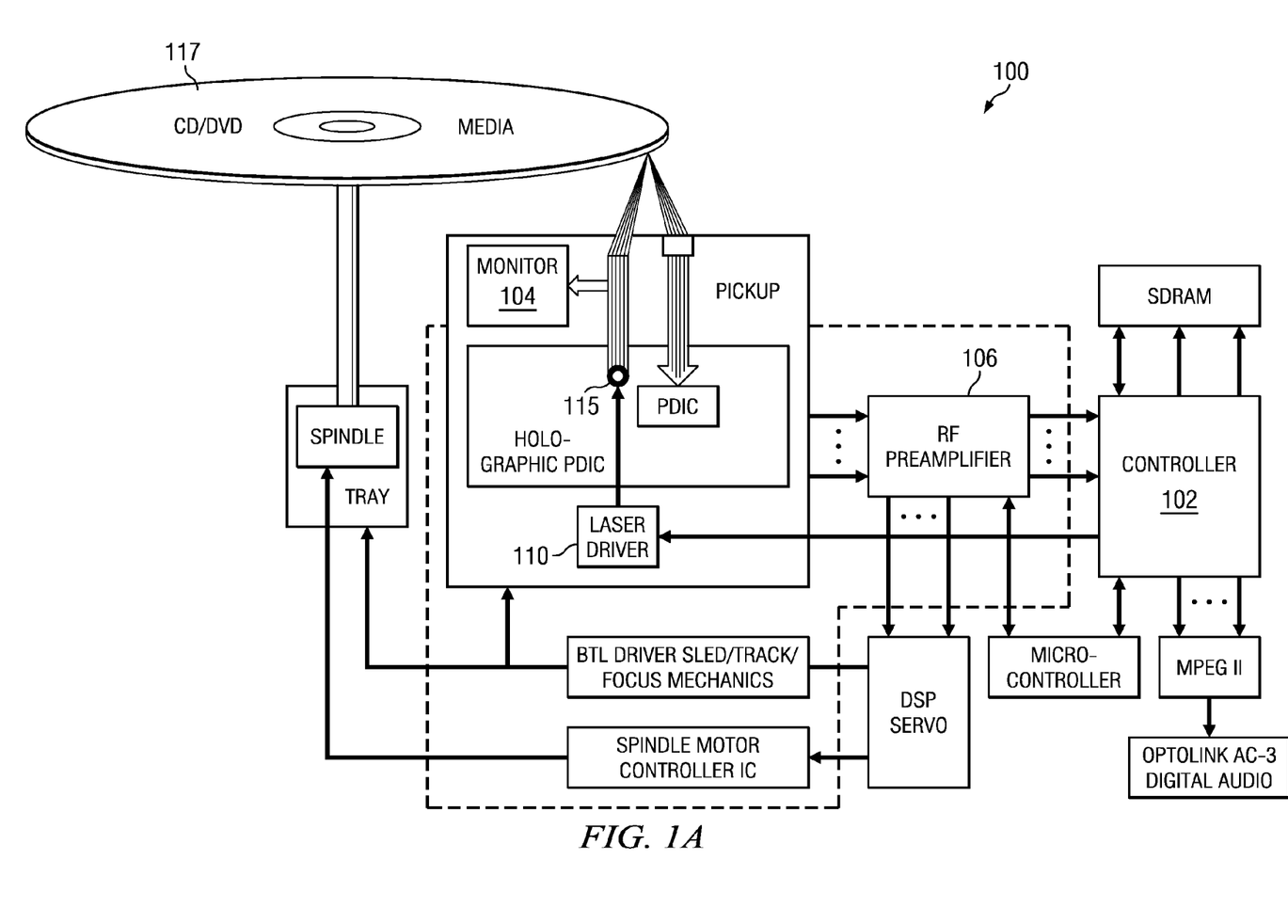
FIG. 1A, is a system drawing illustrating components within an optical disk drive.

Turning now to FIG. 1A, is a system drawing illustrating components within an optical disk drive 100. A controller 102 monitors the output light power level of a laser diode 115 using a Monitor PD 104, or monitor photodiode, and an RF, or radio frequency, preamplifier 106. This controller can keep an expected power level by changing an input control current of a laser driver 110 through an APC, or auto power controlling, feedback loop, even if a light source 115 such as a laser diode, has many changes of the output power due to various condition changes, such as temperature etc.

Also, the controller 102 sets the enable signal for switching some current channels of the laser driver 110, which arranges a data writing pulse. In die case of data reading, the controller 102 may only set the DC current by disabling the switching and applying the indicated input current. In the case of data writing, the controller 102 applies some adjustment signals, or enable-switching signals, to arrange the writing pulse waveform as a combination of switching timing, which also changes the power level by different indicated current of each channel. The controller 102 can arrange these indicated currents based on the Monitor PD 104 output with some detecting function in the RF preamplifier 106. At the very least, this controller has two controlling levels for the reading power and the writing power. Sometimes the controller may get the top, bottom, or average level of a writing pulse and calculate to control some power levels independently.

As illustrated in this figure, the laser driver 110 sends a signal that prompts an associated light source 115 (e.g., laser diode) to emit light. The light source 115 may emit light at any of a number of wavelengths (e.g., 400 nm, 650 nm, 780 nm). Light from this source contacts an associated optical media 117, such as a compact disc (CD), blue ray device (Blu-ray), or digital versatile disk (DVD). Light contacting the optical media can either facilitate data storage or data retrieval from the optical media 117.

Figure 1B:
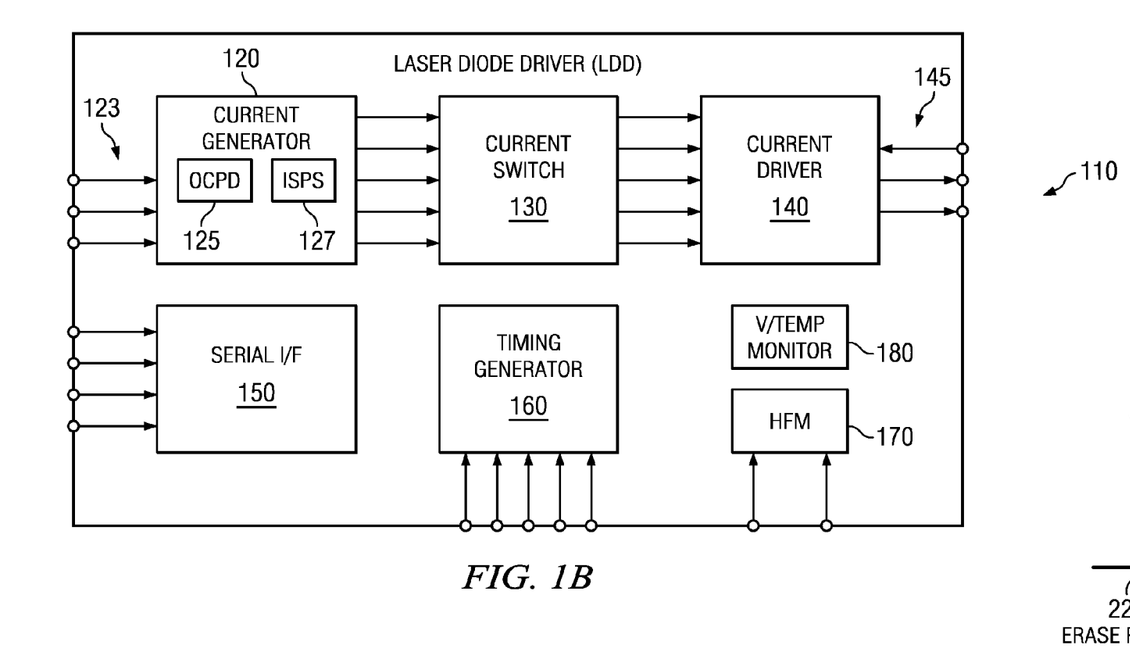
FIG. 1B is an enlarged view of the innovative laser driver, which may be a laser diode drive (MD).

FIG. 1B is an enlarged view of the innovative laser driver 110, which may be a laser diode drive (LDD). The LDD 110 is an integrated, fully programmable, multi-function product that controls and drives laser diodes (e.g., light source 115) within optical drives as described with reference to FIG. 1A. More specifically, the LDD 110 can apply the current for the read, write, and erase removable high capacity disks capacities greater than approximately 50 Gbytes/disk). The LDD 110 also has low noise (e.g., noise of approximately 0.5 nA/rt-Hz), high speed (e.g., 1 Gb/S, 0.850 Gb/s) and high current (e.g., approximately 1 amp). Any numbers included in this application are for illustrative purposes only and numerous alternative implementations may result from selecting different quantitative values.

At a high level, the LDD 110 may include a current generator 120. Generally, the current generator 120 receives some input signals 123 associated with several input channels, which have an associated input current. This current generator 120 works in tandem with a current driver 141) and produces a gain for the input current. As a result, the current generator 120 and current driver 140 control the amount of current for each output channel 145. For the input signals that the current generator 120 receives, it transmits output signals that a current switch 130 receives. The current switch 130 decides which of the input channels should be turned on or turned off. For the channels that should be turned on, the current switch 130 makes those channels active. Similarly, the current switch 130 inactivates the channels that should be turned off and transmits output signals reflecting this change. The current driver 140 receives these output signals from the current switch 130 as input signals. The current driver 140 is the last current gain stage and drives the laser diode directly. In other words, the output signals from the current driver 140 also serve as output signals for the LDD 110, which are used in driving the lasers, or the light source 115 (see FIG. 1A).

In addition to the above-mentioned devices, the LDD 110 includes additional components. A serial interface (I/F) 150 has several inputs 155 (e.g., serial data enable, serial data, serial clock) that may be used for an enable, feature selection, or setting the gain. Like the serial interface 150, the timing generator 160 receives various channel enable inputs 165. Though there are five channel enable inputs that are shown in FIG. 1B, the LDD 110 may have any number of channel enable inputs, such as two, six, or the like. The timing generator 160 determines the time at which a given input channel will be either turned on or turned off. The LDD 110 also includes a high frequency modulator (HFM) 170 and voltage/temperature monitor (V/Temp Monitor) 180. The HFM 170 modulates the output current for reducing mode-hopping noise of the laser diodes. The voltage/temperature monitor 190 monitors the laser diode voltage drop and on-chip temperature. One skilled in the art will appreciate that numerous alternative implementations may result from removing any or several of the blocks within the LDD 110.

Figure 2:
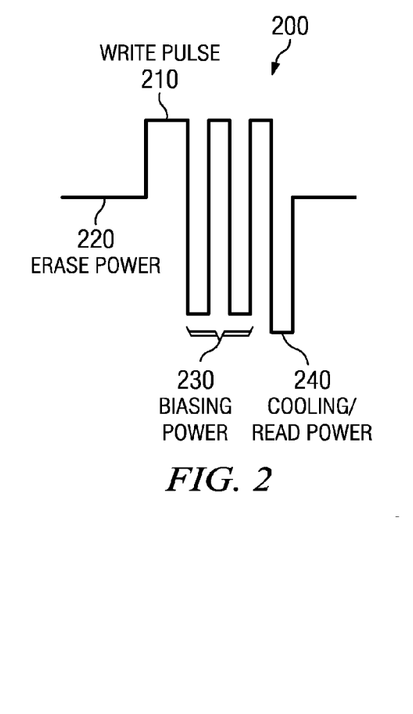
FIG. 2 is a graph illustrating an output waveform for the laser diode driver of FIG. 1B.

A laser diode driver (LDD) 110 in an optical pick up applications can generate an output signal 200 as shown in FIG. 2. For this signal, there are four current levels in this case: write power level 210, erase power level 220, biasing power level 230 and a cooling/read power level 240. Each level may come from either the output of one channel or the combination of the outputs of several channels, like the output channels 145 (see FIG. 1A). Depending on the applications, sometimes there may be even more power levels that the LDD 110 generates. The input current to each input channel in applications, input channels 123 (see FIG. 1A) may be limited to a few milliamps (e.g., approximately 2 mA) and the total input current may vary from approximately 0 mA to approximately 4 mA.

As illustrated in FIG. 1B, the current generator 120 includes an overprotection device 125 and a laser diode driver input signal processing system (ISPS) 127 used with input current signal received on input channels 123. Transmitting a high current output signal directly to a laser diode can easily destroy this device. The LDD 110 protects an associated laser diode by including an over current protection device (OCPD) 125 within the current generator 120. The OCPD 125 closely monitors the input current associated with the input signal. When the input current exceeds a predetermined limit level, this OCPD can either shut down all of the input channels or switch the over-current channel's output to the predetermined limit level.

Figure 3:
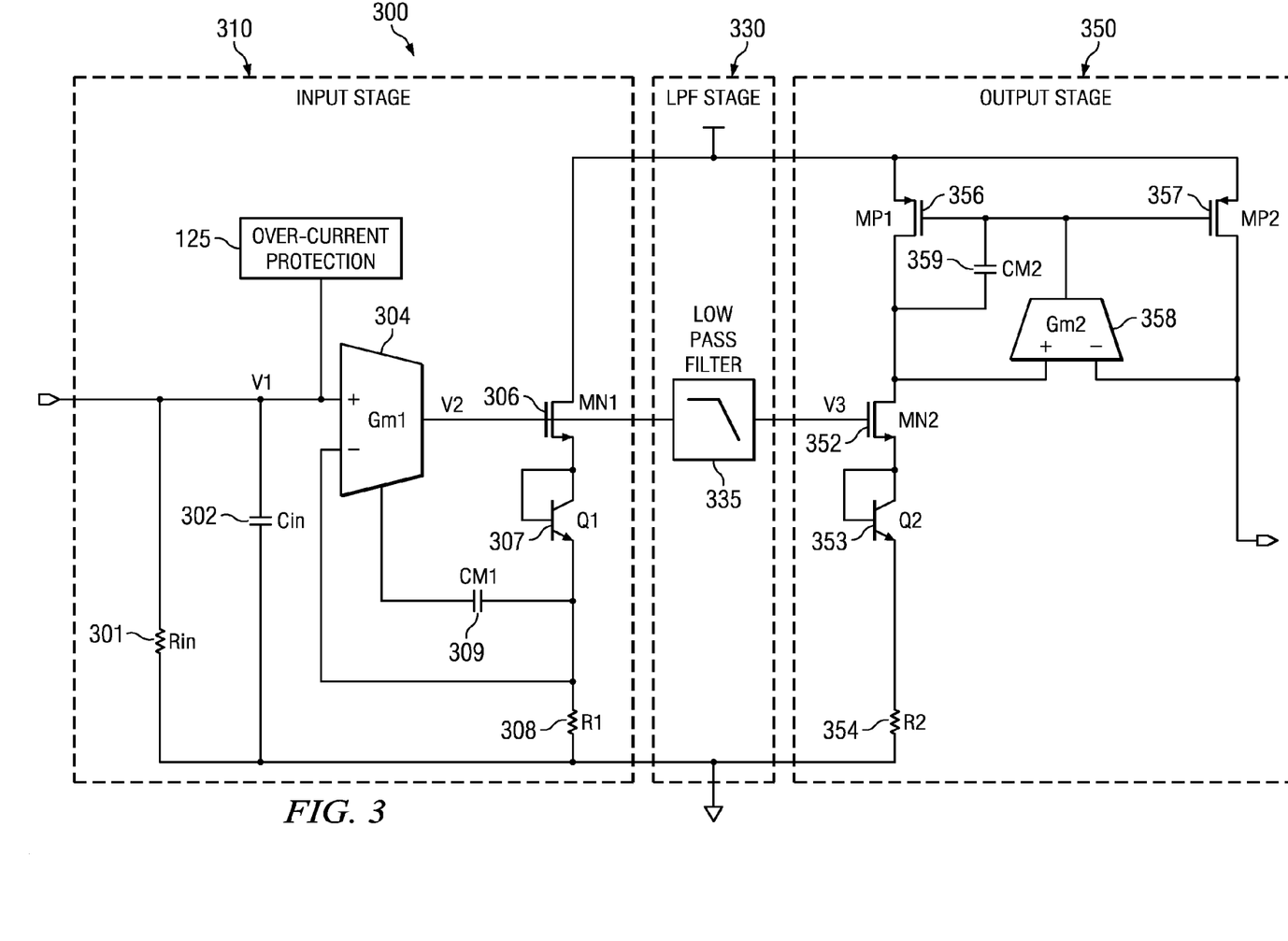
FIG. 3 is a circuit diagram illustrating for the ISPS of FIG. 2 that includes an input stage, low pass filter (LPF) stage, and an output stage 350.

FIG. 3 is a circuit diagram 300 for the ISPS 127 that includes an input stage 310, low pass filter (LPF) stage 330, and an output stage 350. Numerous implementations may result by varying the types and number of devices included within each stage. An alternative implementation may not include all three stages. For example, one implementation may include simply the input stage 310 and the LPF stage 330.

As shown in FIG. 3, the input current associated with an input current signal that enters the input stage 310 will first be sinked by a resistor 301 ($R_{in}$) to be converted to a voltage V1 associated with a voltage signal. The capacitor 302 ($C_{in}$) provides limited filtering function for very high frequency noise and smoothes out the input voltage to the transconducting device 304 (Gm1). This voltage V1 may be used for over-current protection detection with threshold level trimmable depending on the application. In other words, this voltage may be used with the over current protection device 125. If the incoming current is larger than a certain pre-set threshold value, this device will either limit the current to the threshold level or essentially shut down the driver. Coupling noise from an actuator (e.g., a servo chip's track actuator) will be filtered out by an on-chip LPF with corner frequency adjustable from approximately 3 KHz to approximately 675 KHz that is described with reference to the LPF stage 330. In order to filter out this coupling noise, the voltage V1 is converted to a current signal through the transconducting device 304 (Gm1), active device 306 (MN1), active device 307 (Q1), passive device 308 (R1), and a capacitor 309 (CM1). Therefore, the LPF stage 330 receives a second voltage signal corresponding to the voltage V2. The values associated with these devices may vary. For example, R1 may have a resistance of approximately 2 KOhms, CM1 may have a capacitance of approximately 3 pF, device MN1 may have a threshold voltage of approximately 0.7V, while device Q1 may have a threshold voltage of approximately 0.7V.

The input stage 310 shown in FIG. 3 is merely one of many possible implementations. An alternative implementation may result by removing the capacitor 302, capacitor 309, or both the capacitor 302 and the capacitor 309. In addition, another implementation may occur by replacing the bipolar active device 307 with other type of devices such as a Metal-Oxide-Silicon (MOS) device, resistor, or the like. Yet, another implementation may occur by replacing MOS active device 306 with other type of devices, such as a bipolar active device. Another implementation may occur by using any one of several types of circuits for over-current protection. In other words, the over current protection device 125 may include a plurality of input channels for receiving an input signal; a plurality of low pass filters coupled to a first group of the plurality of input channels, wherein each low pass filter is associated with one input channel within the first group of input channels, the plurality of low pass filters operative for removing spikes in associated with the input signal; and a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level, wherein the over current protection device is on chip with the laser diode driver.

Figure 4:
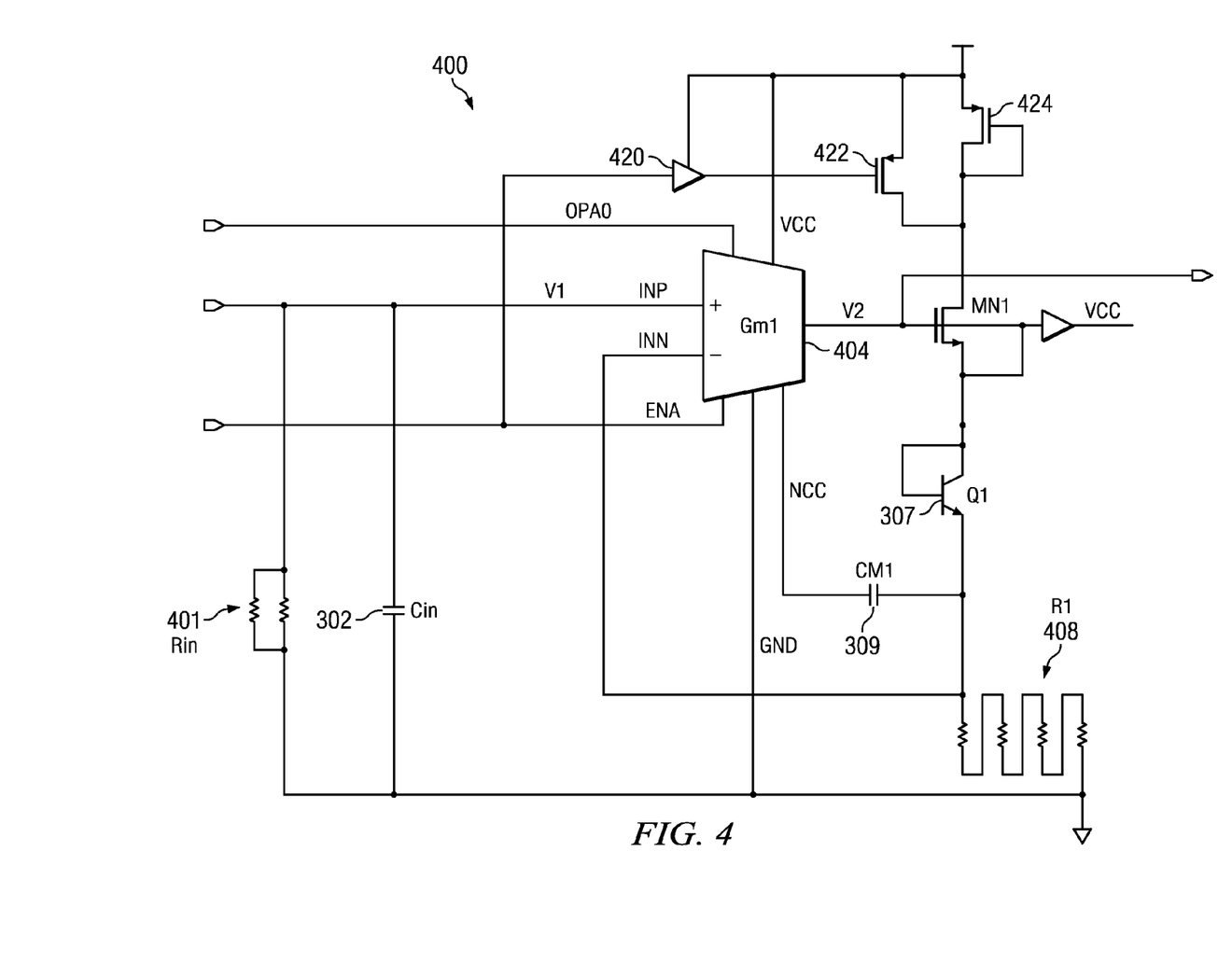
FIG. 4 is a circuit diagram for one implementation of the input stage of FIG. 3.

FIG. 4 is a circuit diagram 400 for one implementation of the input stage 310 described with reference to FIG. 3. As mentioned above, similar devices have the same reference numerals. In this implementation, the passive device 401 is shown as two resistors in parallel, which may have resistances of approximately 1 KOhms. There is also a passive device 408 shown as a four resistors in series, though the number of resistors in series may be 2, 3, 6 or the like. In addition, the resistances of these devices may range from approximately 1 KOhms to approximately 10 KOhms. The circuit diagram 400 may also include an inverter 420, active device 422, and active device 424. Together, inverter 420 and active device 422 serve as pullup devices to save power in sleep mode. In an alternative implemenatio, the active device 424 may not be included. When it is, it can help in some cases to reduce the voltage headroom at the drain of MN1 device and also serve as current mirror input devices to ship out the current through MN1/Q1/R1 devices if needed.

Figure 5:
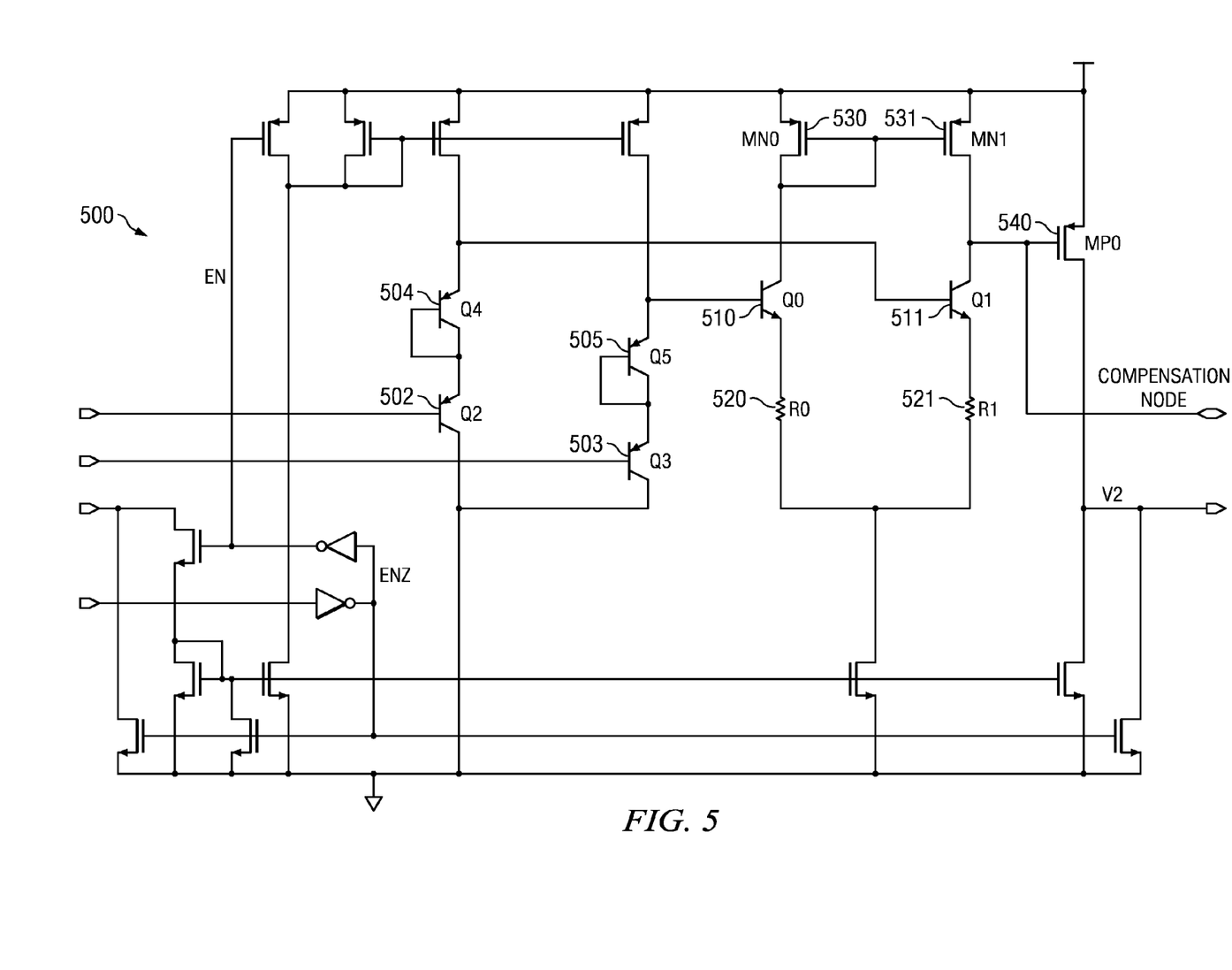
FIG. 5 is a circuit diagram for one implementation of the transconductance device of FIG. 3.

The transconducting device 404 may have many implementations by varying the devices that make of this device. Turning now to FIG. 5, this is a circuit diagram 500 for one implementation the transconducting device 404. In this implementation there are four active devices 502-505 (Q2~Q5) function as emitter followers to shift up the input voltage level by approximately 1.5 V. The circuit diagram 500 also includes an input differential pair made up of active devices 510-511 (Q0-Q1) are the input differential pair. The passive devices 520-521 (R0-R1) associated with the differential pair assist with degeneration that lowers gain and improves matching between active device 510 (Q0) and active device 511 (Q1). Finally, the circuit diagram 500 includes a current mirror formed by two active devices 530-531 (MN0-MN1) that connect to a second gain stage formed by 540 (MP0). An alternative implementation may result from including other devices in the second gain stage.

Returning to the LPF stage 330 shown in FIG. 3, the voltage V1 gets converted to a noisy, current signal. The LPF stage 330 substantially reduces the noise and produces a reduced noise voltage signal. In this implementation, die LPF stage 330 includes a LPF 335 with a corner frequency trimmable from approximately 3 KHz to approximately 675 KHz. In an alternative implementation, the LPF stage 330 may include more than one LPF. The reduced noise voltage signal V3 biases the active device 352 (MN2), active device 353 (Q2), and the passive device 354 (R2). In one implementation, the characteristics of these devices may be selected so that they are proportional to, or match, the devices 306-307. Using the LPF stage 330 produces an essentially noiseless current signal for the output stage at the drain of the active device 332 (MN2).

The output stage 350 includes additional components that improve accuracy and stability. More specifically, this output stage includes a current mirror formed from active devices 356-357. The transconducting device 358 (Gm2) reduces the voltage headroom requirements on active devices 356-357, or the voltage drop from source to drain of active devices 356-357 and improves the current mirror's accuracy. An active device 359 (CM2) is a miller compensation capacitor that enhances the stability of the feedback loop around the transconducting device 358 (Gm2). An alternative implementation may not include this miller compensation capacitor. Like this output stage, the input stage 310 also includes a miller compensation capacitor, or active device 309 (CM1); it enhances the stability of the feedback loop around the transconducting device (Gm1). In another alternative implementation of the output stage 350, the output current from the drain of active device 357 (MP2) may be further processed via a scaler, digital to analog converter (DAC), and an output driver, or the like. Alternatively, the over-current protection device 125 can also be placed after LPF, which means the current will be stable without much noise.

Figure 6:
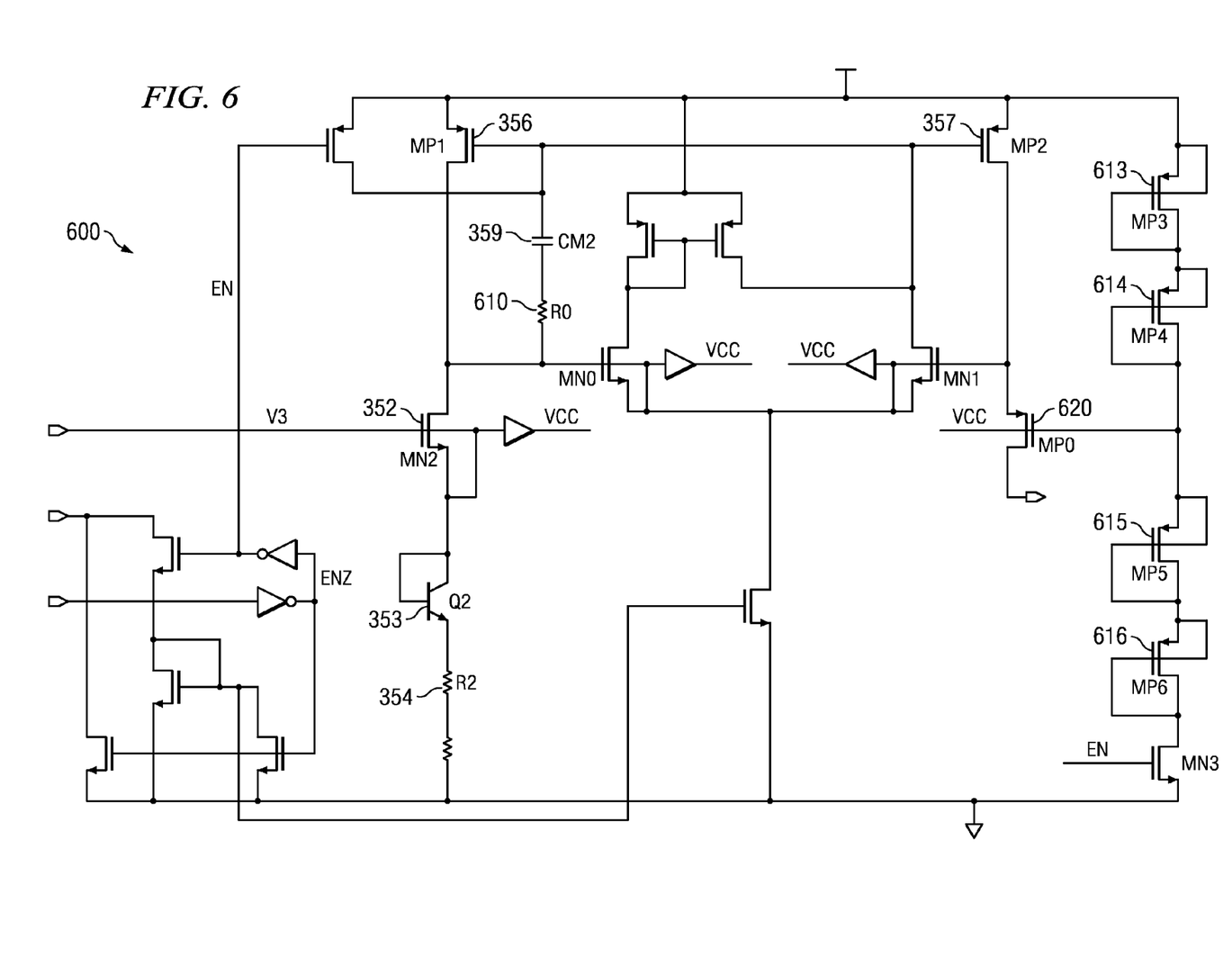
FIG. 6 is a circuit diagram for one implementation of the output stage of FIG. 3.

FIG. 6 is a circuit diagram 600 for an implementation of the output stage 350 of FIG. 3. In this implementation, the passive device 610 (R0) connects to the miller miller compensation capacitor and improves stability. Active device 613 (MP3) through active device 616 (MP6) provide a gate bias voltage for output current passing transistor MP0, or active device 620, at the drain of active device 357 (MP2). Active device 620 limits the positive feedback loop's gain to less than that of the negative feedback loop's gain, which enhances stability. An alternative implementation may result from removing either one of the miller capacitors that generally stabilize the associated feedback loop or from changing the transistor types. Even still, another implementation may result from using a low voltage compliance, but high precision current mirror in lieu of the active devices 356-357 that is configured differently.

While various embodiments of the signal processing system have been described, it may be apparent to those of ordinary skill in the art that many more embodiments and implementations are possible that are within the scope of this system. Although certain aspects of the input signal processing system may be described in relation to specific techniques or structures, the teachings and principles of the present system are not limited solely to such examples. All such Modifications are intended to be included within the scope of this disclosure and the present input signal processing system and protected by the following claim(s).

The invention claimed is:

1. An input signal processing system for an input current signal, comprising:
   a transconductance cell having a first input, second input, and an output, wherein the first input is coupled to receive the input signal;
   a first resistor coupled to a first input of the transconductance cell, wherein the first resistor converts the input current signal to an input voltage signal;
   a first voltage-current converter coupled to the output, the second input, the resistor, and a low voltage supply, wherein the first voltage-current converter is operative for converting, the input voltage signal to a input current signal;
   a low pass filter having an input coupled to the voltage converter for filtering noise from the input current signal;
   a second voltage-current converter coupled to the low pass filter and a low voltage supply, wherein the second voltage-current converter is operative for converting a voltage signal to an output current signal; and
   a current mirror coupled to the low pass filter and the second voltage-current converter, the current mirror operative for producing a low noise output signal in response to receiving the output current signal.

2. The input signal processing system of claim 1, wherein the first voltage-current converter comprises a first transistor of a first type, a second transistor in series with the first transistor and of a second type; a resistor in series with the second transistor.

3. The input signal processing system of claim 1, further comprising: a capacitor coupled to the input and the low voltage supply, wherein the capacitor is operative for at least one of filtering the high frequency noise and smoothing the input voltage signal.

4. The input signal processing system of claim 1, wherein the low pass filter has an adjustable corner frequency from approximately 3 KHz to approximately 675 KHz.

5. The input signal processing system of claim 1, further comprising an over current protection device.

6. The input signal processing system of claim 5, wherein the over current protection device further comprises:
   a plurality of input channels for receiving an input signal;
   a plurality of low pass filters coupled to a first group of the plurality of input channels, wherein each low pass filter is associated with one input channel within the first group of input channels, the plurality of low pass filters operative for removing spikes in associated with the input signal; and
   a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level,
wherein the over current protection device is on chip with the laser diode driver.

7. The input signal processing system of claim 1, wherein the transconductance cell further comprises a device selected from the group consisting of a differential pair, emitter followers, and level shifters.

8. The input signal processing system of claim 1, wherein the current mirror further comprises a miller compensation capacitor.

9. The input signal processing system of claim 1, wherein the first voltage converter comprises a first set of devices, and the second voltage converter comprises a second set of devices, and the first set of devices are matched with the second set of devices.

10. The input signal processing system of claim 1, further comprising a second transconductance device coupled to the second current voltage converter, the current mirror and an output.

11. A driver associated, comprising:
an input signal processing system comprising:
    a first transconductance device having a first input, second input, and an output, wherein the first input is coupled to receive the input signal;
    a first resistor coupled to a first input of the first transconductance device, wherein the first resistor converts the input current signal to an input voltage signal;
    a first voltage-current converter coupled to the output, the second input, the resistor, and a low voltage supply, wherein the first voltage-current converter is operative for converting the input voltage signal to a input current signal; and
    a low pass filter having an input coupled to the voltage converter for filtering noise from the input current signal.

12. The driver of claim 11, further comprising an output stage comprising:
    a current mirror coupled to the low pass filter and an output node; and
    a plurality of series connected devices coupled between the low pass filter, the current mirror and a low voltage supply.

13. The driver of claim 12, further comprising a second transconductance device coupled to the low pass filter, the current mirror, the output node, and the series connected devices.

14. The driver of claim 12, wherein the series connected devices include devices selected from the group consisting of a MOS transistor, a bipolar transistor, and a resistor, wherein the series connected devices operate as a voltage-current converter.

15. The driver of claim 11, wherein the input signal processing system is a part of a current generator.

16. An optical disk drive system, comprising:
a controller monitoring an output power lever of laser diode and transmitting adjustment signals for varying the output power level;
a laser driver operatively coupled to the controller for receiving the adjustment signals, the laser driver having an input signal processing system, comprising:
    a first transconductance device having a first input, second input, and an output, wherein the first input is coupled to receive the input signal;
    a first resistor coupled to a first input of the first transconductance device, wherein the first resistor converts the input current signal to an input voltage signal;
    a first voltage-current converter coupled to the output, the second input, the resistor, and a low voltage supply, wherein the first voltage-current converter is operative for converting the input voltage signal to a input current signal; and
    a low pass filter having an input coupled to the voltage converter for filtering noise from the input current signal.

17. The optical disk drive system of claim 16, further comprising: a capacitor coupled to the input and the low voltage supply, wherein the capacitor is operative for at least one of filtering the high frequency noise and smoothing the input voltage signal.

18. The optical disk drive system of claim 16, further comprising an over current protection device.

19. The optical disk drive system of claim 18, wherein the over current protection device further comprises:
    a plurality of input channels for receiving an input signal;
    a plurality of low pass filters coupled to a first group of the plurality of input channels, wherein each low pass filter is associated with one input channel within the first group of input channels, the plurality of low pass filters operative for removing spikes in associated with the input signal; and
    a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level,
    wherein the over current protection device is on chip with the laser diode driver.

20. The optical disk drive system of claim 16, wherein the voltage converter comprises a first transistor of a first type, a second transistor in series with the first transistor and of a second type; a resistor in series with the second transistor.

* * * * *